United States Patent [19]

Moyer

[11] 4,002,926
[45] Jan. 11, 1977

[54] HIGH SPEED DIVIDE-BY-N CIRCUIT

[75] Inventor: Norman E. Moyer, Newport Beach, Calif.

[73] Assignee: Hughes Aircraft Company, Culver City, Calif.

[22] Filed: Oct. 2, 1975

[21] Appl. No.: 619,097

[52] U.S. Cl. .............................. 307/225 C; 307/208; 307/224 C; 307/279; 328/48; 235/92 DM
[51] Int. Cl.² ....................................... H03K 21/36
[58] Field of Search ....... 307/221 C, 223 C, 224 C, 307/225 C, 225 R, 218, 279, 205, 208, 215; 328/48, 51; 235/92 DM

[56] References Cited

UNITED STATES PATENTS

| | | | |
|---|---|---|---|
| 3,614,632 | 10/1971 | Leibowitz et al. | 328/48 X |
| 3,646,371 | 2/1972 | Flad | 328/48 X |
| 3,706,043 | 12/1972 | Reinert | 307/225 R |
| 3,864,582 | 2/1975 | Keeler | 307/223 C |
| 3,899,691 | 8/1975 | Hama | 307/223 C |

OTHER PUBLICATIONS

Arithmetic Operations In Digital Computers by R. K. Richards pp. 194–195, Sci. Lib. 1957.

*Primary Examiner*—John S. Heyman
*Attorney, Agent, or Firm*—Fay I. Konzem; William H. MacAllister

[57] ABSTRACT

Disclosed is a high speed divide-by-N circuit which uses both a synchronous down-counter and a ripple down-counter to obtain the advantages of each. The advantage of a ripple counter is that count propagation time is not critical, and the advantage of a synchronous counter is that its state can be decoded quickly. Therefore, by combining the two different types of counters, keeping the gate delays per clock cycle as low as possible, using look-ahead techniques, and giving more time-consuming operations more time to occur, a high speed divide-by-N circuit is obtained. Said circuit is intended for integration on a single chip, particularly using CMOS design and processing.

10 Claims, 6 Drawing Figures ofHIGH SPEED DIVIDE-BY-N CIRCUIT

BACKGROUND OF THE INVENTION

1. Field of the Invention

This invention relates to divide-by-N counters and more particularly to a divide-by-N circuit using both a synchronous down-counter and a ripple down-counter.

2. Description of the Prior Art

A divide-by-N counter will divide by a specific number of counts. That is, for N clock pulses put into the circuit, only one output pulse is generated. If an M bit binary counter is used in the divide-by-N circuit, N must be less than $2^M$.

A synchronous counter is one in which all bits of the counter change state simultaneously in response to a common clock. Since all flip-flops change simultaneously, the output (or count or state) can be decoded quickly because there is no count propagation to wait for. A binary synchronous down-counter is one in which each stage will change if the preceding higher frequency stage is going to make a zero to one transition with the next clock pulse. A synchronous down-counter is designed by using shift register bits with additional logic gating at their input terminals which will cause the above-mentioned output changes to occur.

Ripple counters use the output and its inverse of a counting element, a toggle flip-flop, to drive the two-phase clock input of the following counting element. In ripple counters, the flip-flops operate in a toggle mode (i.e., they change with each clock pulse), with the outputs of each flip-flop driving the clock inputs of the following stage. A limitation of all ripple counters is that some state changes require a transition to ripple through many or all stages of the counter. In a down-counter each toggle flip-flop changes state on each zero to one transition of the previous stage. The counter is implemented by connecting the clock input of each stage to the $\overline{Q}$ output of the previous stage, and the $\overline{\text{clock}}$ input to the Q output. (This assumes a two-phase toggle flip-flop which changes on the clock falling edge.) The propagation delays through the counting elements are added together. In a long high-speed counter, the transition of the last stage can be considerably delayed from the input pulse that caused it. This fact forbids the use of "look ahead" or state decoding logic.

In comparison with a synchronous counter, a ripple counter requires less gating to count properly. In ripple counters, the outputs of one flip-flop are used as the clocks to another flip-flop, whereas synchronous counters use the same clock input to drive all flip-flops, but require further logic to determine when to make transitions. Furthermore, in CMOS there is a power savings in using a ripple counter because every bit runs at half the frequency of the preceding bit, rather than at the input clock frequency.

A limitation with the synchronous counter is its speed of operation. Each stage has logic to determine whether it should change with the next clock pulse. This logic must do its job in a little less than one clock cycle so that it is set up for the next clock pulse. Thus, the logic is doing a "look ahead" function but has little time to do so. Two techniques are available. One is called "parallel look ahead" and requires that every stage have gating with inputs from every faster stage. This loads the faster stages and creates multi-input gates, both factors which slow down the circuit. The other technique is called "ripple look ahead," where each stage combines its state with a signal generated in all previous stages to create a signal (called the carry in) that goes to the following stage. This logic is slow because it requires one gate per stage, which is nearly as bad as the delay in a ripple counter.

The present invention has combined the speed independence of a long ripple counter and the high speed state decode of a short, fast synchronous counter to produce a high speed divide-by-N circuit. This invention also keeps the gate delays per clock period low, uses look ahead techniques, and gives more time-consuming operations more time to occur. The last is enabled by gating out a clock pulse at a critical point, thus giving some circuitry nearly two clock periods to respond properly.

OBJECT AND SUMMARY OF THE INVENTION

It is an object of this invention to provide a high speed divide-by-N circuit which is made up of both a synchronous down-counter and a ripple down-counter. The circuit in accordance with this invention consists of a short synchronous down-counter and a ripple down-counter, each cleverly configured and combined with additional circuitry to produce a high speed divide-by-N circuit.

The features of the present invention which are believed to be novel are set forth with particularity in the appended claims. The present invention, both as to its organization and manner of operation together with further objects and advantages thereof, may be better understood by reference to the following description, taken in connection with the accompanying drawings.

BRIEF DESCRIPTION OF THE DRAWINGS

Finally.

DETAILED DESCRIPTION

Figure 1:
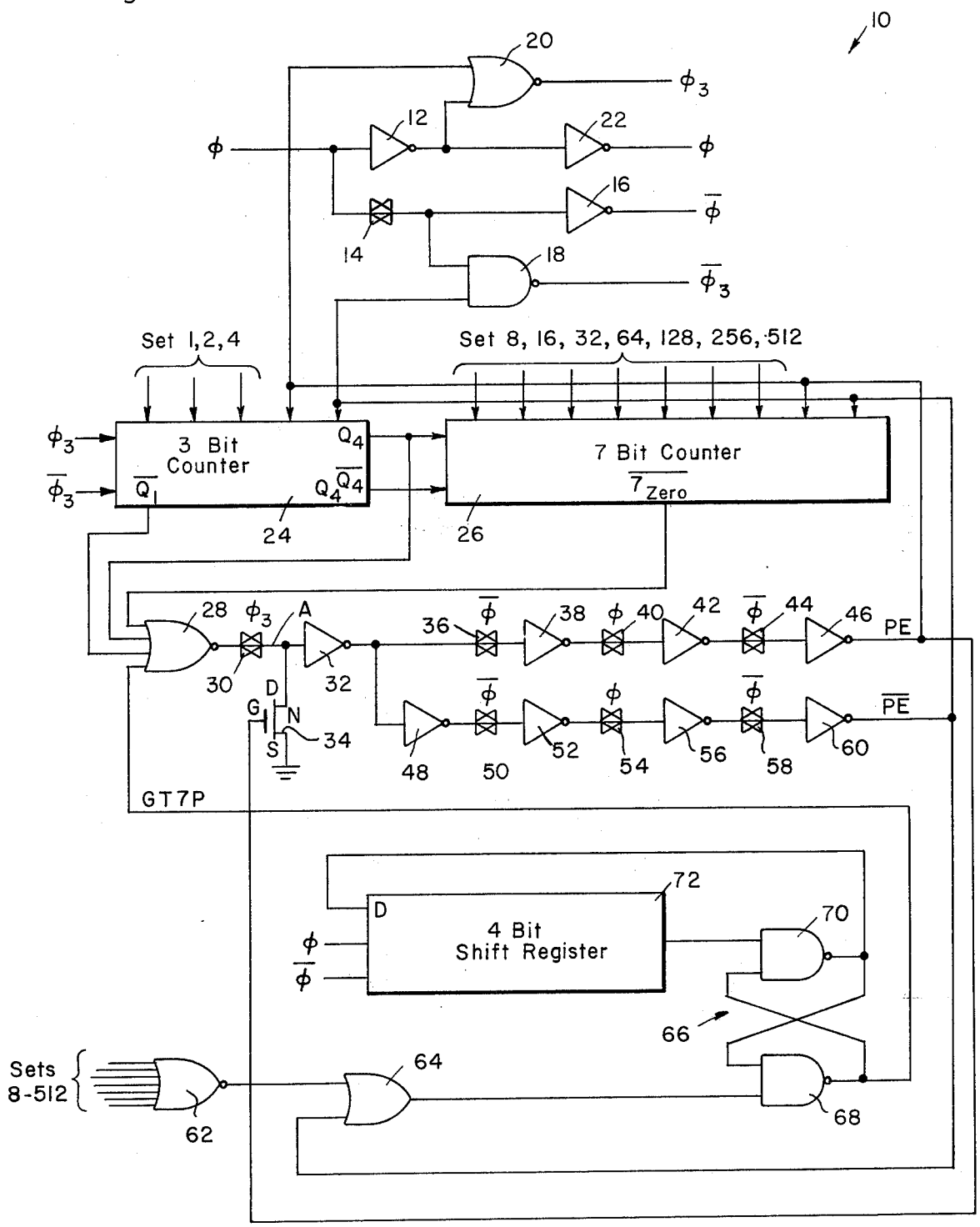
FIG. 1 is a block diagram of the divide-by-N circuitry of the present invention.

Referring now to FIG. 1, the divide-by-N circuit 10 includes three-bit presettable binary dynamic synchronous down-counter 24 and seven-bit presettable binary static ripple down-counter 26. The input clock $\Phi$ goes to inverter 12 and through transmission gate 14 to inverter 16 and to a first input to NAND gate 18. Transmission gate 14 is always turned on and serves as a delay equal to that of inverter 12 so that the two-phase clocks generated are almost exactly out of phase. The output of inverter 12 goes into a first input to NOR gate 20 and inverter 22. The output of NOR gate 20 is $\Phi_3$, the output of inverter 22 is $\Phi$, the output of inverter 16 is $\overline{\Phi}$ and the output of NAND gate 18 is $\overline{\Phi}_3$; that is, two two-phase clocks. Three-bit synchronous down-counter 24 has two clock inputs $\Phi_3$ and $\overline{\Phi}_3$ and three binary set inputs — set 1, set 2, and set 4. The $Q_4$ and $\overline{Q}_4$ outputs of counter 24 are the clocks of the seven-bit down-counter 26. The $\overline{Q_1}$ output of the counter 24 goes into NOR gate 28 as does the $Q_4$ output. The $\overline{7\text{ zero}}$ output from seven-bit counter 26 is also delivered into NOR gate 28. Binary set inputs, sets 8, 16, 32, 64, 128, 256 and 512, are delivered into seven-bit counter 26. The output of NOR gate 28 is delivered through $\Phi_3$ clocked transmission gate 30 at point A to the input of inverter 32 and to the drain of NMOS 34. The output of inverter 32 is delivered to the input of inverter 48. Both these signals got 3/2 bit dynamic shift registers consisting of a $\Phi$ clocked transmission gate (36,50), inverter (38,52), $\overline{\Phi}$ clocked transmission gate (40,54), inverter (42,56), $\overline{\Phi}$ clocked transmission gate (44,58), and final inverter (46,60). The output of inverter 46 is the preset enable signal (PE) and goes to NMOS 34, counter 26, counter 24 and to a second input to NOR gate 20. The output of inverter 60, the preset enable ($\overline{PE}$) signal is delivered to OR gate 64, counter 26, counter 24 and to a second input to NAND gate 18.

The seven inputs to NOR gate 62 are the sets 8 to 512. The output of NOR gate 62 is delivered to a first input to NOR gate 64. The second input to OR gate 64 is $\overline{PE}$. The output of OR gate 64 is delivered to a first input to NAND gate 68, which in conjunction with NAND gate 70 makes up a latch circuit composed of cross coupled gates. The output of NAND gate 68 is delivered to a first input to NAND gate 70 and this signal, GT7P, is also delivered to a fourth input to NOR gate 28. The second input to NAND gate 70 is delivered from four-bit shift register 72, which is clocked by $\Phi$ and $\overline{\Phi}$ and has as the D input the output of NAND gate 70.

In summary, the divide-by-N circuitry 10 of FIG. 1 consists of three-bit presetable dynamic synchronous binary down-counter 24, seven-bit presetable static ripple binary down-counter 26, two two-phase clock generating means (consisting of equal delay elements inverter 12, transmission gate 14, inverters 16 and 22, NOR gate 20 and NAND gate 18), a four input NOR gate 28 which detects the state 3 whose output is fed to two short shift registers, a four-bit shift register 72, and some logic (gates 62, 64, 68, 70) to prevent false 3 detection immediately after a preset.

Figure 2:
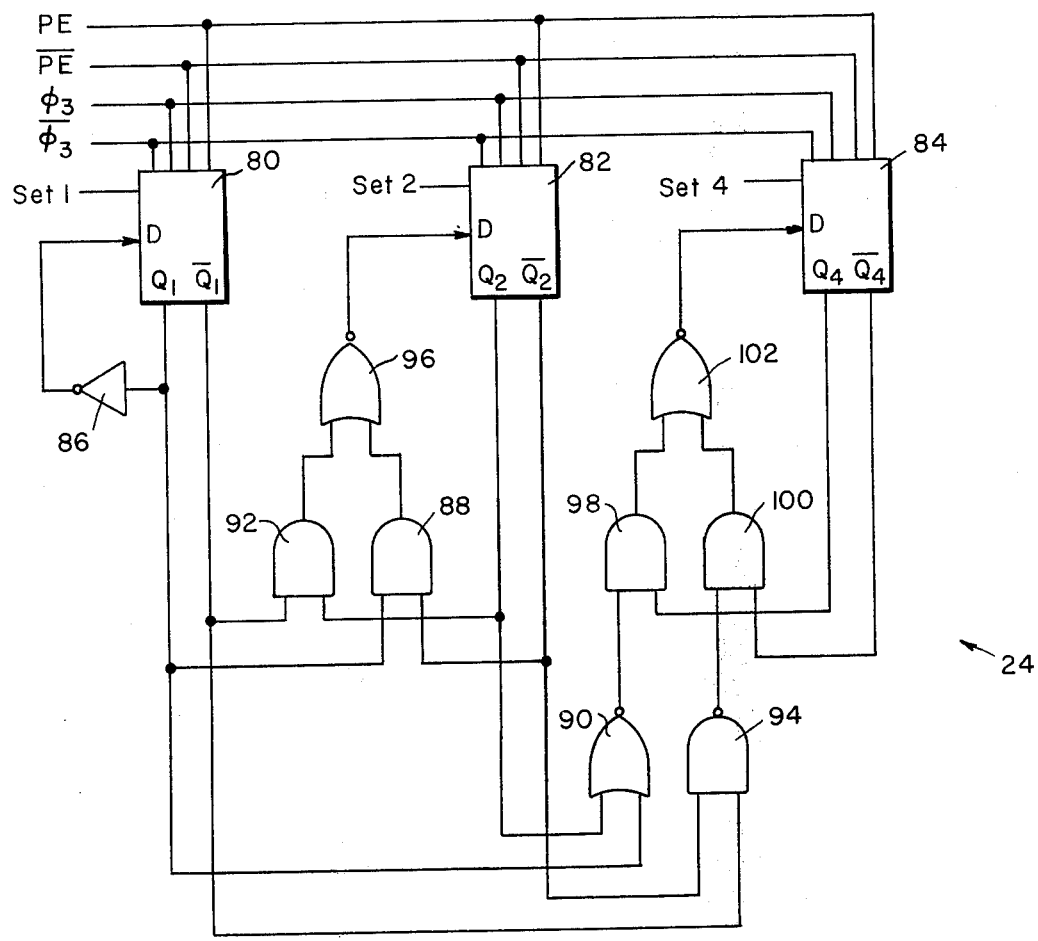
FIG. 2 is a schematic representation of the three-bit synchronous down-counter of FIG. 1.

FIG. 2 shows a detailed schematic of the three-bit counter 24 of FIG. 1. Delay or D type flip-flop 80 has six inputs as do D flip-flops 82 and 84. These inputs include the preset enable PE and its inverse $\overline{PE}$, two-phase clocks $\Phi_3$ and $\overline{\Phi}_3$, the set signal which determine the state the flip-flop takes when a PE occurs, and the D input signal. In D flip-flop 80, the Q output is fed through inverter 86 back to the D input and to a first input to AND gate 88 and to a first input to NOR gate 90. The $\overline{Q}$ output from flip-flop 80 is delivered to a first input to AND gate 92 and to a first input to NAND gate 94. The Q output from D flip-flop 82 is delivered to a second input to AND gate 92 and to a second input to NOR gate 90. Finally, the $\overline{Q}$ output from D flip-flop 82 is delivered to a second input to AND gate 88 and to a second input of NAND gate 94. The outputs of AND gates 88 and 92 are inputed into NOR gate 96 which outputs a signal to the D input to flip-flop 82. The Q output of flip-flop 84 is delivered into a first input to AND gate 98. The output from NOR gate 90 is inputed into the second input to AND gate 98. The $\overline{Q}$ output from flip-flop 84 is inputed into a first input to AND gate 100 and the output of NAND gate 94 is inputed into a second input to AND gate 100. The outputs of AND gates 99 and 100 are inputs to NOR gate 102 which in turn forms the D input of flip-flop 84. Forming the D input to flip-flop 84 has the largest number of gate delays per clock cycle of any part of the circuit when in the counting (not presetting) mode. The above-mentioned gates (86, 88, 92, 96, 90, 94, 98, 100, 102) force the three-bit counter 24 to count down in a synchronous manner that utilizes a parallel look ahead technique. No more than two gates plus intra flip-flop delays must be traversed each clock cycle. When the preset enable is pulsed to a logic one the state of the set lines is loaded into the counter. Only the first half (or master section) of the D flip-flops needs to be preset because additional logic guarantees that $\overline{\Phi}_3$ is a logic 1 during a PE pulse enabling the preset data to appear at the Q and $\overline{Q}$ outputs and preventing signal degradation and power increase due to the D input coming in through a $\Phi_3$ clocked transmission gate.

Figure 3:
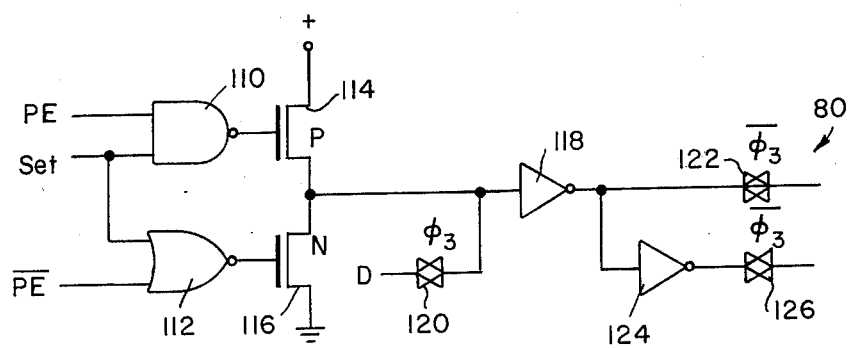
FIG. 3 is a schematic drawing of the shift register bit of the three-bit counter of FIG. 2.

FIG. 3 shows the circuitry for the D flip-flops 80, 82, and 84. NAND gate 110 has two inputs — the preset enable PE and the set input. The output of NAND gate 110 is connected to the gate of a P-channel MOSFET 114. The source of MOSFET 114 is connected to the positive supply voltage and the drain of this MOSFET is connected to the drain of N-channel MOSFET 116 and to the input to inverter 118. NOR gate 112 has two inputs — the set input and the $\overline{PE}$ signal. The output of NOR gate 112 is connected to the gate of N-channel type MOSFET 116. The source of MOSFET 116 is connected to ground, the negative supply. The D input is connected through $\Phi_3$ clocked transmission gate 120 to the input to inverter 118. And the output of inverter 118 is connected to $\overline{\Phi}_3$ clocked transmission gate 122 and through inverter 124 to $\overline{\Phi}_3$ clocked transmission gate 126. This connection allows the Q and $\overline{Q}$ outputs to attain their proper states as quickly after $\overline{\Phi}_3$ goes high as is possible.

Figure 4:
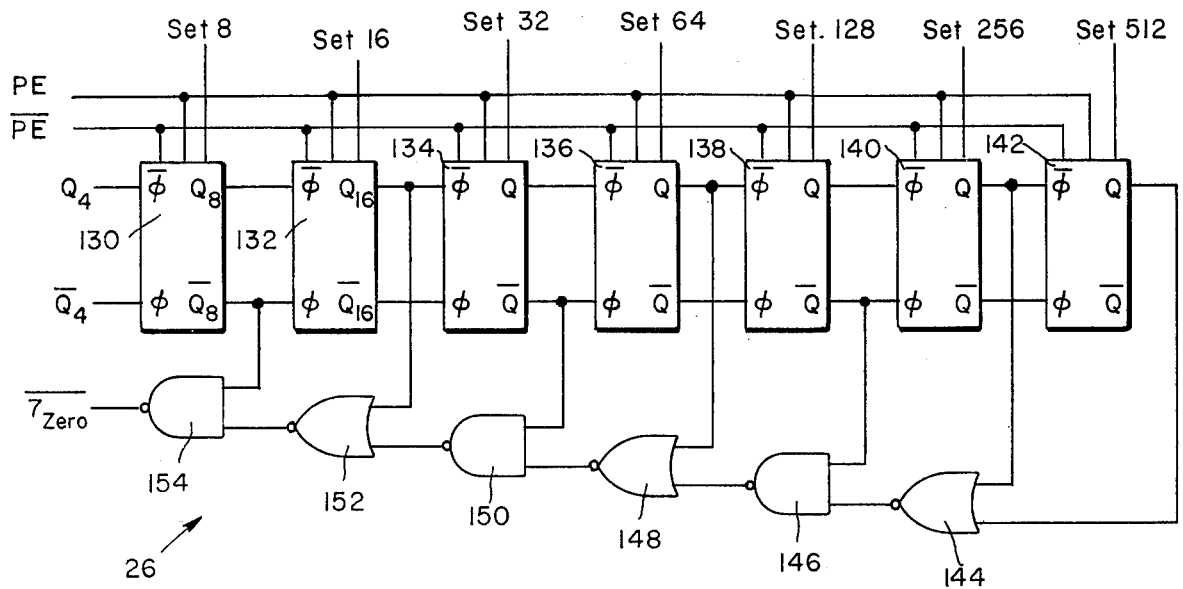
FIG. 4 is a schematic representation of the seven-bit ripple down-counter of FIG. 1.

FIG. 4 shows the circuitry used to make up the seven-bit counter 26. Each of the toggle flip-flops 130 through 142 has five inputs, a set line to control the state it presets to, the preset enable (PE) input and its inverse $\overline{PE}$, and two phase clocks. Toggle flip-flop 130 has $Q_4$ and $\overline{Q}_4$ from the three-bit counter 24 as clocks. The Q and $\overline{Q}$ outputs from each toggle flip-flop are the clocks of the next toggle flip-flop. The Q output from flip-flop 142 and the Q output from flip-flop 140 are delivered to two input NOR gate 144. The output of NOR gate 144 and the $\overline{Q}$ output of flip-flop 138 are inputs to two input NAND gate 146. The output of NAND gate 146 and the Q output of flip-flop 136 are inputs to two input NOR gate 148. The output of NOR gate 148 and the $\overline{Q}$ output of flip-flop 134 are inputs to two input NAND gate 150. The output of NAND gate 150 and the Q output of flip-flop 132 are inputs to two input NOR gate 152. Finally, the output of NOR gate 152 and the $\overline{Q}$ output of flip-flop 130 are inputs to two input NAND gate 154. The output signal from NAND gate 154 is designated as $\overline{7\text{ zero}}$. It is at logic 0 when the entire counter is in the 0 state; that is every bit is at logic 0. In the seven-bit ripple counter 26 of FIG. 4, speed is not necessary because the maximum frequency is eight times slower than the input, so the main goal is simple, but static, logic. The slow ripple chain (gates 144 through 154) which detects that the counter is in state zero is quite satisfactory because the order in which the bits comes to logic "zero" is known: Because the count is down, the most significant bit 142, the next most significant bit 140, and finally the least significant bit 130 arrive at logic "zero." Thus, each gate in the ripple chain has a great deal of time to respond and there is no ripple except possibly during a preset operation. The toggle flip-flops 130–142 must have an asynchronous preset because during a preset, the clock level of each bit is not known or stable. In the toggle flip-flops, the preset circuitry and the transmission gates could try to force a circuit node to opposite states. Thus, by design, the preset must override and this is done by ratioing impedances so that feedback transmission MOSFETs are higher impedance than those driven by preset circuitry.

Figure 5:
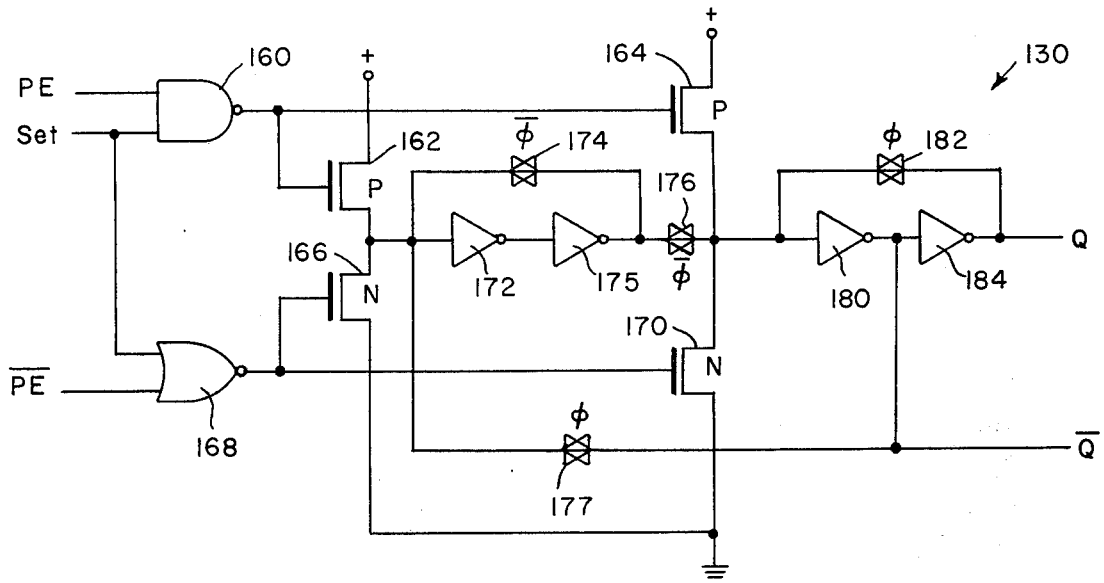
FIG. 5 is a schematic drawing of the toggle flip-flops used in the seven-bit ripple counter of FIG. 4.

FIG. 5 shows a schematic representation of the toggle flip-flop used in the seven-bit down-counter. NAND gate 160 has as inputs the PE signal and the set signal. The output of NAND gate 160 is connected to the gates of P-channels MOSFETs 162 and 164. The sources of P MOSFETs 162 and 164 are connected to the positive voltage supply, the drain of MOSFET 162 is connected to the drain of N-channel type MOSFET 166 and the input of inverter 172, and the drain of MOSFET 164 is connected to the drain of N-channel MOSFET 170 and the input of inverter 180. NOR gate 168 has as inputs the set signal and the $\overline{PE}$ signal. The output of NOR gate 166 is connected to the gates of MOSFETs 166 and 170. The sources of MOSFETs 166 and 170 are connected to the negative supply. The output of inverter 172 goes to the input of inverter 175, whose output connects back through transmission gate 174 to the input of inverter 172, and through transmission gate 176 to the input to inverter 180. The output of inverter 180, the $\overline{Q}$ output of the flip-flop, is connected to the input of inverter 184 and through transmission gate 177 back to the input of inverter 172. The output of inverter 184, the Q output of the flip-flop, is connected through transmission gate 182 back to the input of inverter 180.

Figure 6:
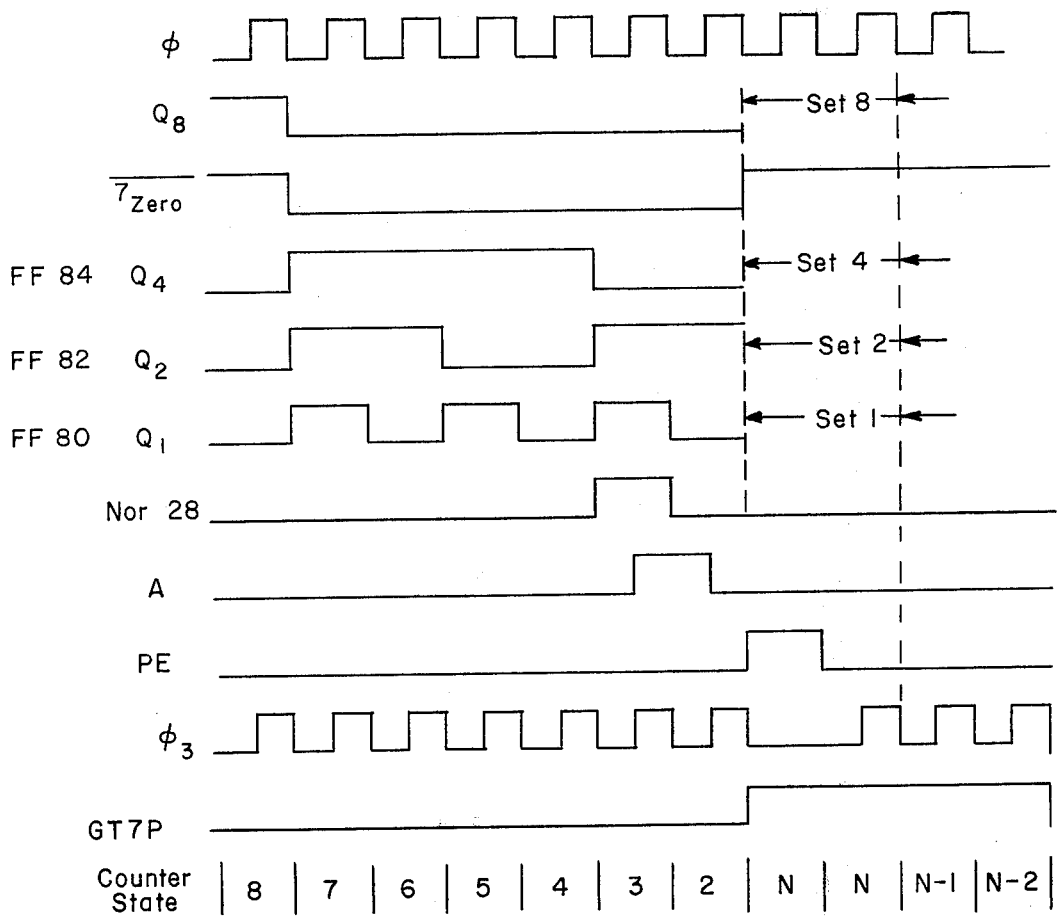
FIG. 6 shows a timing diagram representing the various outputs of the various elements of the divide-by-N circuitry.

FIG. 6 is a timing diagram showing the various levels of the signals in relation to the input clock $\Phi$ and the counter states. The counter states are states 8 through N-2. As mentioned previously, the two counters are down-counters. At counter-state 8, the output from flip-flop 130 goes to a low binary level as does the $\overline{7}$ $\overline{zero}$ output from NAND gate 154. The Q output from D flip-flop 184, the Q output from flip-flop 182 and the Q output from flip-flop 180 of the three-bit synchronous counter 24 all go to a high binary level at this time. At counter state three, the four inputs to NOR gate 28; i.e., $\overline{7\ zero}$ output from flip-flop 84, the inverse output from flip-flop 80, and the GT7P signal all are at a low binary level; thereby making the output of NOR GATE 28 go high. This signal and its inverse are loaded into short shift registers and emerge two clock periods later as PE and $\overline{PE}$ which let the set information be forced into the respective flip-flops. Then the down count starts anew.

In more detail, the timing diagram starts with the down-counter at counter state 8. The next $\Phi$ pulse causes $Q_8$ (the output from flip-flop 130) to go to logic zero and thus, since now all seven highest order bits are at logic zero, the signal $\overline{7\ zero}$ goes to a logic zero. The four input NOR 28 has $Q_4$ as an input, so $\overline{7\ zero}$ has four clock periods before it must attain its proper state. The down-counting continues until state 3 is detected by the four input NOR gate 28. The gate also detects state 1, but it never occurs because that is when PE occurs. The gate 28 output is clocked by $\Phi_3$ into two inverters whose outputs are loaded into one and one-half bit shift registers. The NOR gate 28 has nearly a clock period to respond to state three and is helped along because the load on the output of the $\Phi_3$ transmission gate is intentionally small. Two clock periods after the four input NOR gate 28 had a logic one output, the delayed signals PE and $\overline{PE}$ appear. The short shift registers allow time to buffer up from small to large devices so that fast, low impedance signals will be available. PE and $\overline{PE}$ remove a pulse from the $\Phi_3$ clock, thus allowing a synchronous ($\Phi$ time only) preset in the on counter 24 and also providing one clock period to preset data in and another clock period for the count look ahead logic to get set up. PE has half a clock period to become valid because that is when the $\Phi_3$ pulse needs to be blocked. The missing $\Phi_3$ clock pulse and the NMOS 34 gated by PE prevent the possibility of having the circuit lock up in a stable state where PE is high, the $\Phi_3$ transmission gate on the output of NOR 28 is off, and its output is floating at a high level, maintaining PE at a high level. It also prevents a false 3 decode which would create an unwanted PE two clock cycles later. If any of the counter bits in the seven-bit counter will be preset to a 1, NOR gate 62 detects this and when $\overline{PE}$ goes to 0, thru OR gate 64 and NAND gate 68, the GT7P (greater than seven pulse) signal is forced high. The purpose of this pulse, which has nearly two clock periods to become valid, is to block the four input NOR gate 28 from a logic one output until $\overline{7\ zero}$, which is generated in a long ripple chain, is valid. The four-bit shift register removes GT7P after four clock pulses, giving $\overline{7\ zero}$ four clock periods to become valid. If N is under 8, GT7P never goes high, but $\overline{7\ zero}$ is always valid at logic 0.

Although the device which has just been described appears to afford the greatest advantages for implementing the invention, it will be understood that various modifications can be made thereto without going beyond the scope of the invention, it being possible to replace certain elements by other elements capable of fulfilling the same technical functions therein.

What is claimed is:
1. A divide-by-N circuit comprising:
   an input clock;
   a synchronous down-counter for providing a high speed decode of a particular counter state;
   said synchronous down-counter having an output;
   a ripple down-counter, which is connected to and clocked by said output of said synchronous down-counter, for providing a counter of predetermined length, which is not required to quickly decode;
   a plurality of gates which provide a gated clock;
   said input clock being fed into said gates; and
   said gated clock being inputed into said synchronous counter.
2. The divide-by-N circuit as recited in claim 1, wherein said synchronous counter comprises:
   a three-bit counter with parallel look-ahead circuitry;
   said look-ahead circuitry comprising a plurality of logic gates.
3. The divide-by-N circuit as recited in claim 1, wherein said synchronous counter consists of a plurality of delay flip-flops, said flip-flops having look-ahead logic connected to their D inputs, and said delay flip-flops being clocked by said gated clock.
4. The divide-by-N circuit as recited in claim 3, wherein said delay flip-flops have a synchronous preset, said preset operates when said gated clock is in a predetermined state.

5. The divide-by-N circuit as recited in claim 3, wherein said delay flip-flops have Q and $\overline{Q}$ outputs, which change in parallel on a predetermined edge of said gated clock.

6. The divide-by-N circuit as recited in claim 3, wherein said delay flip-flop comprises:
a NAND gate having a first and second input and an output;
a NOR gate having a first and second input and an output;
a first and second FET having a source, drain, and gate;
a first, second, and third transmission gate having an input and an output;
a first and second inverter having an input and an output;
said second input to said NAND gate being connected to said first input of said NOR gate;
said output of said NAND gate being connected to said gate of said first FET, said source of said first FET being connected to a positive voltage supply and said drain of said first FET being connected to said source of said second FET;
said output of said NOR gate being connected to said gate of said second FET and said drain of said second FET being connected to ground;
said output of said first transmission gate being connected to said drain of said first FET and to said input of said first inverter;
said output of said first inverter being connected to said input of said second inverter and to said input of said second transmission gate; and
said output of said second inverter being connected to said input of said third transmission gate.

7. The device as recited in claim 1, wherein said ripple down-counter comprises a plurality of toggle flip-flops having a plurality of outputs and having "all zero" detection circuitry, said circuitry consists of a ripple chain of two-input logic gates, said gates having a first and second inputs, said first input connected to one of said outputs of said toggle flip-flops and said second input connected to the output of said preceding logic gate.

8. The device of claim 1, wherein one of the outputs of said synchronous counter is connected through a logic gate to a shift register, which presets said synchronous and ripple counters.

9. The divide-by-N circuit as recited in claim 7, wherein said toggle flip-flop comprises:
a NAND gate having a first and second input and an output;
a NOR gate having a first and second input and an output;
a plurality of FETs having a gate, source, and drain;
a plurality of inverters having an input and an output;
a plurality of transmission gates having an input and an output;
said second input of said NAND gate being connected to said first input of said NOR gate;
said output of said NAND gate being connected to said gate of said first FET and to said gate of said second FET;
said sources of said first and second FETs being connected to a positive voltage supply;
said drain of said first FET being connected to said source of said third FET and said drain of said third FET being connected to the drain of said fourth FET;
said output of said NOR gate being connected to said gate of said third FET and to said gate of said fourth FET and said drains of said third and fourth FETs being connected to ground;
said drain of said first FET being connected to said input of said first inverter and to said input of said first and second transmission gates;
said output of said first inverter being connected to said input to said second inverter;
said output of said second inverter being connected to said input to said third transmission gate and to said output of said first transmission gate;
said output of said third transmission gate being connected to said input to said third inverter, to said input to said fourth transmission gate, to said drain of said second FET and to said source of said fourth FET;
said output of said third inverter being connected to said input of said fourth inverter and to said output of said second transmission gate; and
said output of said fourth inverter being connected to said output of said fourth transmission gate.

10. The divide-by-N circuit as recited in claim 1, wherein said synchronous counter comprises:
a plurality of flip-flops having a D input, a preset enable input, an inverted preset enable input, a clock input, and an inverted clock input, said flip-flops also having a Q and inverted Q outputs;
a first AND gate having first and second inputs and an output;
a second AND gate having first and second inputs and an output;
a first NOR gate having first and second inputs and an output;
a second NOR gate having first and second inputs and an output;
a first NAND gate having first and second inputs and an output;
a third AND gate having first and second inputs and an output;
a fourth AND gate having first and second inputs and an output;
a third NOR gate having first and second inputs and an output;
an inverter connected between the Q output of said first flip-flop and the D input of said flip-flop;
said Q output of said first flip-flop is connected to said first input to said first AND gate and to said first input to said second NOR gate;
said $\overline{Q}$ output of said first flip-flop is connected to said first input to said second AND gate and to said first input to said first NAND gate;
said $\overline{Q}$ output of said second flip-flop is connected to said second input to said second AND gate and to said second input to said second NOR gate;
said $\overline{Q}$ output of said second flip-flop is connected to said second input to said first AND gate and to said second input to said first NAND gate;
said output of said first AND is connected to said first input to said first NOR gate and said output of said second AND gate is connected to said second input of said first NOR gate;
said output of said first NOR gate is connected to said D input to said second flip-flop;
said output of said first NAND gate is connected to said first input to said third AND gate;
said output of said second NOR gate is connected to said first input to said fourth AND gate;

said Q output of said third flip-flop is connected to said second input to said third AND gate;

said $\overline{Q}$ output of said third flip-flop is connected to said second input of said fourth AND gate;

said output of said third AND gate is connected to said first input to said third NOR gate;

said output of said fourth AND gate is connected to said second input to said third NOR gate; and said output of said third NOR gate is connected to said D input to said third flip-flop.

* * * * *